United States Patent [19]

Kujas

[11] Patent Number: 4,685,608

[45] Date of Patent: Aug. 11, 1987

[54] SOLDERING APPARATUS

[75] Inventor: Erich F. Kujas, Philadelphia, Pa.

[73] Assignee: RCA Corporation, Princeton, N.J.

[21] Appl. No.: 792,472

[22] Filed: Oct. 29, 1985

[51] Int. Cl.$^4$ ............... B23K 31/02; B23K 35/24; H05B 5/00; H05B 6/64

[52] U.S. Cl. ............... 228/227; 228/240; 219/85 A; 219/85 BM; 219/10.57; 219/10.71

[58] Field of Search ............... 228/227, 231, 239, 240; 219/85 A, 85 BA, 85 BM, 9.5, 10.41, 10.57, 10.71

[56] References Cited

U.S. PATENT DOCUMENTS

| 3,754,109 | 8/1973 | Moulin et al. | 219/9.5 |
| 3,760,142 | 9/1973 | Schoenthaler | 219/85 BA |
| 4,154,998 | 5/1979 | Luft et al. | 219/10.49 R |
| 4,364,508 | 12/1982 | Lazzery et al. | 228/106 |
| 4,382,833 | 5/1983 | Coyle et al. | 156/382 |
| 4,431,891 | 2/1984 | Forstner et al. | 219/9.5 |
| 4,476,151 | 10/1984 | Keller et al. | 228/231 |

Primary Examiner—Nicholas P. Godici
Assistant Examiner—Samuel M. Heinrich
Attorney, Agent, or Firm—Clement A. Berard, Jr.; Robert L. Troike

[57] ABSTRACT

A solar array panel is formed of a matrix of solar cell subarrays and wired together to form an integral power unit. The subarrays are soldered by passing them on a conveyor through successive solder melting and solder cooling regions induced by suspended radiating susceptors which are inductively heated. The system induction generator is cycled on and off to create the desired temperature ranges in the applicable regions. The subarrays are carried through the regions by an aluminum alloy plate on a thermally inert conveyor belt. The aluminum alloy plate is substantially unresponsive to radiated heat from the susceptors.

15 Claims, 6 Drawing Figures

SOLDERING APPARATUS

This invention relates to apparatus for radiantly heating and melting solder for soldering connecting links to elements and, more particularly, for soldering and interconnecting solar cells in an array.

Solar cell arrays are widely used for electrical power generation in terrestrial and, particularly, spacecraft applications. Spacecraft applications have stringent reliability requirements to meet the anticipated life of the spacecraft. The solar arrays are required to meet harsh environmental conditions, e.g., launch induced vibrations and thermal cycling due to solar exposure during an orbit. Solar arrays in certain spacecraft applications are required to be thermally cycled within a temperature range of −85° C. to +80° C. or in a range of −160° C. to +60° C. Such thermal cycling causes severe expansion and contraction of the solder joints and may cause their eventual stress failure. Solar arrays for spacecraft applications therefore need to be assembled meticulously and manually to insure that the resulting structure meets its design reliability constraints.

Various fabricating techniques are employed for soldering solar arrays. One example of a solar array fabrication method and apparatus is disclosed in U.S. Pat. No. 4,154,998. The array of components forming the solar cell assembly are subjected to a pressure which retains the components in firm contact with one another. A fusible cladding on the solar cells and on front cell connector strips and rear cell connector elements and the substrate adhesive layer are heated to their fusion temperature by inductively heated metallic susceptors. The susceptors are forced under pressure in contact with the assembled array components. The solar cells and connector strips are adhesively bonded to the substrate and the connector strips and rear connector elements are electrically joined in response to heat and pressure. This direct thermally conductive contact procedure, however, can produce uneven heating and potential poor solder joints.

In a second example, solar arrays, as fabricated for spacecraft applications, are assembled in subarrays which are then interconnected to the final panel array. The subarrays comprise a few solar cells secured to a temporary substrate in which a thin metallic foil mesh is laid across electrodes on the solar cell's rear (nonactive) face. Lengths of solder wire are laid on the metallic mesh. An operator manually inserts the subarray assembly carried by a fixture beneath infrared heating lamps and, after a given time interval, removes the array. The radiation from the infrared heating lamps is intended to melt the solder so that the solder penetrates the wire mesh and connects the mesh to the electrodes on the solar cells. This technique may be repeated as often as necessary on a given subarray because of poor soldering which is visually inspected after each heating cycle. The subarrays are then assembled onto the final panel substrate to which they are to be attached. This includes wiring the soldered meshes and the active face electrodes to form the completed array.

The infrared heating technique is not without drawbacks. The resulting solder joints, in practice, tend to be unreliable and are often required to be resoldered. Further, such repeated soldering is not always effective. Where not effective, the subarrays need to be disassembled or discarded. Because the soldering process is unreliable, often times poor solder joints are discovered in the later completed panel arrays. Reworking such panel arrays is costly and tedious. Because of the manual and tedious requirements of assembling and testing the solar cell arrays employing present technology, a typical 3×5 foot or 4×8 foot panel array may cost in excess of $1 million.

The present inventor has discovered that the infrared heating technique, which is widely used, tends to create uneven heating of solar cell arrays causing localized hot and cold spots. Excessive temperature in the hot spots and insufficient heat in low temperature regions is attributed as the cause of poor solder joints. Therefore, the recycling of arrays in such infrared heating systems tends to expose the array to additional uneven heating creating additional poor soldering or, at best, to be unable to correct the original deficiency. The removal of such unreliable joints is a considerable factor in the cost of solar cell array fabrication.

An apparatus according to the present invention is employed for soldering a link carried by an element. Either the element or the link carries solder which, when melted, bonds the link to the abutting element. The apparatus comprises induction heating means and a heat radiating susceptor spaced from and adapted to be inductively heated by the induction heating means. Also included is an element support adapted for carrying the element, link and solder to be melted. Conveying means carry the support spaced from the susceptor at that distance and moves at that rate which permits the susceptor to radiantly heat the carried solder to melt the solder as it moves along a path through the region heated by the susceptor. As a result, the element, link and solder are exposed to uniform and controlled radiantly induced heat at a temperature sufficient to melt the solder uniformly.

A feature of the invention includes a plurality of susceptors for radiantly heating a plurality of spaced regions through which regions the support is carried. The link and solder are successively exposed to alternate heat sufficient to melt the solder and a reduced temperature region sufficient to permit the solder to solidify. The successive alternate melting and solidifying of the solder tends to remove trapped air and other flaws to produce a reliable solder joint.

Figure 1:
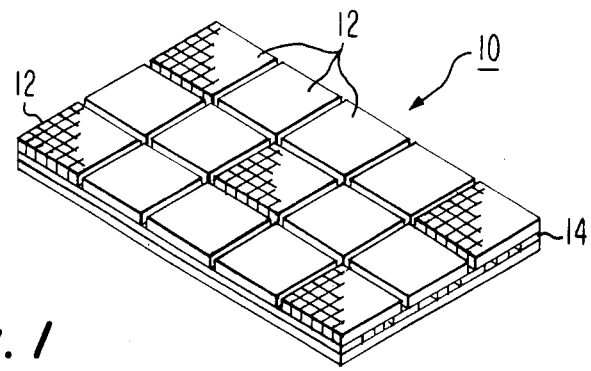
FIG. 1 is an isometric view of a solar array panel including a plurality of subarrays each assembled by an apparatus constructed and operated in accordance with one embodiment of the present invention.
Figure 3:
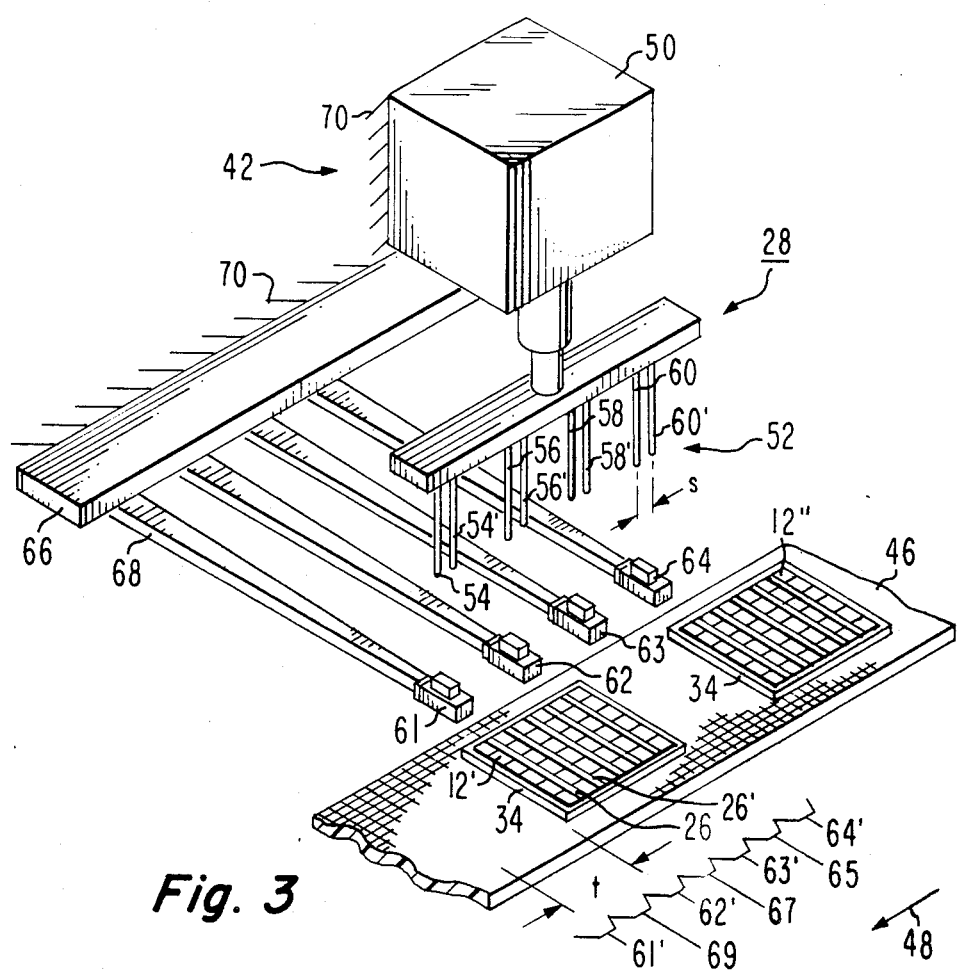
FIG. 3 is an isometric view, partially schematic, of an apparatus according to one embodiment of the present invention.
Figure 2:
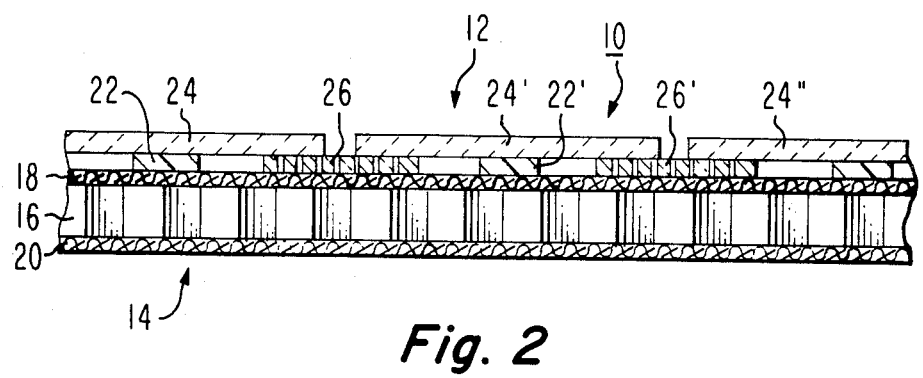
FIG. 2 is an elevation cross-sectional view of a portion of one subarray of the panel of FIG. 1 illustrating the solar array construction in more detail.

In FIGS. 1 and 2, solar cell panel 10 is employed in a spacecraft application. Panel 10 comprises a plurality of solar cell subarrays 12. The subarrays 12 are soldered by the apparatus of the present invention, as illustrated in FIG. 3, and then later assembled to form the panel 10. The subarrays 12 of solar cells in panel 10 are secured to a support 14. In FIG. 1, the panel 10 may comprise a 18×30 array of solar cells divided into subarrays having a 6×6 matrix of cells. However, larger or smaller panels may be employed according to a given implementation.

In FIG. 2, support 14 comprises a honeycomb core 16 and a pair of face skins 18 and 20 on opposite core surfaces. Typically, the core 16 may be a honeycomb fiber reinforced epoxy or aluminum. The face skins 18 and 20 typically employ multiple plies of fiber reinforced epoxy materials. A drop of adhesive 22 secures a solar cell 24 to support 14. Cell 24' adjacent cell 24 is secured to panel 14 by a drop of adhesive 22'. All cells are thus secured to the support by a separate adhesive drop. An alternative to employing dots of adhesive 22, 22' and so forth for securing each of the cells of a subarray 12 to the support 14, an adhesive layer (not shown) can be coated on the entire surface of face skin 18 of the support 14 for gluing the cells and the links 26, 26' and so forth, directly to that face skin. Cell 24 represents an array of aligned cells lying one behind the other into the drawing FIGURE. Cell 24' represents a similar array of aligned cells extending into the drawing FIGURE as does cell 24" and so forth to form the array matrix.

A silver mesh-like connecting link 26 which may comprise a thin sheet of perforated foil, e.g., five to ten mils thick, is soldered to the rear face electrodes (not shown) of the solar cells. For example, link 26 is soldered to the rear face electrodes of the array of cells aligned with cell 24 and the next adjacent array of cells aligned with cell 24'. The front face of the cells facing away from the support 14 is active and faces the light. In the FIGURES, the thickness of the links 26 and 26' and other dimensions are not to scale and are exaggerated for purpose of illustration.

In practice, the subarrays 12 may comprise one-foot square panels which, when assembled to the support 14, FIG. 1, form the completed panel. The subarrays 12 are electrically interconnected by wires (not shown) soldered to the links 26, 26' and so forth, FIG. 2 and other cell electrodes (not shown) to complete the electrical interconnection. The wires extend through holes (not shown) in the support 14, FIG. 2. The wires are connected to form the panel into an integral power supply system. By way of example in FIG. 1, the links of the subarrays 12 extend parallel to the long dimension of the panel. The ends of the links at the edges of each subarray have a wire (not shown) soldered thereto. These wires extend through panel 14 to the rear side opposite the cells and connected to a link on the adjacent subarray. These subarrays are then interconnected in a known sequence according to a given implementation. In FIG. 3, soldering system 28 solders the links of each subarray 12, for example, subarrays 12' and 12" to the juxtaposed cells. These soldered subarrays are then assembled later, as convenient, into a larger panel in different overall dimensions as needed in a matrix of multiple one-foot-square subarrays.

Figure 4:
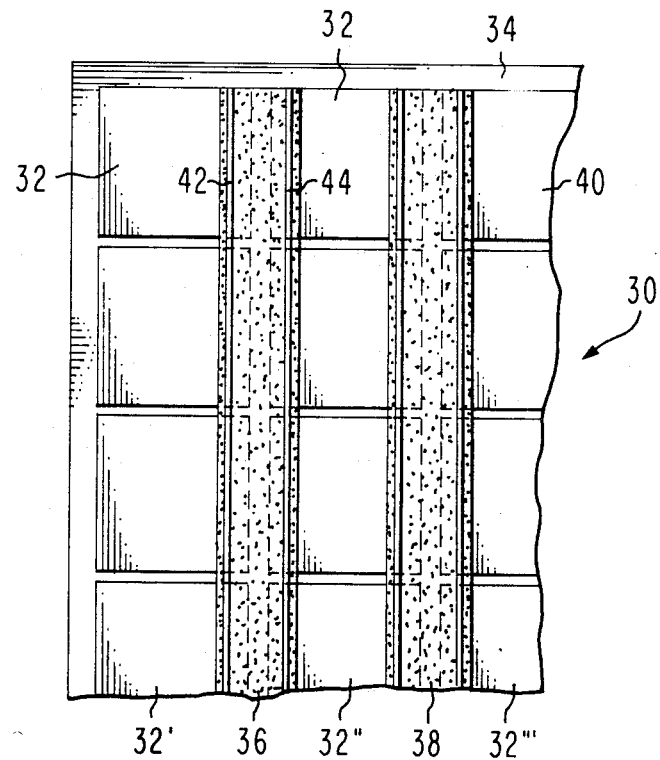
FIG. 4 is a plan view of a portion of a cell carrier and a subpanel array of solar cells on the carrier to be soldered by the apparatus of FIG. 3.
Figure 5:
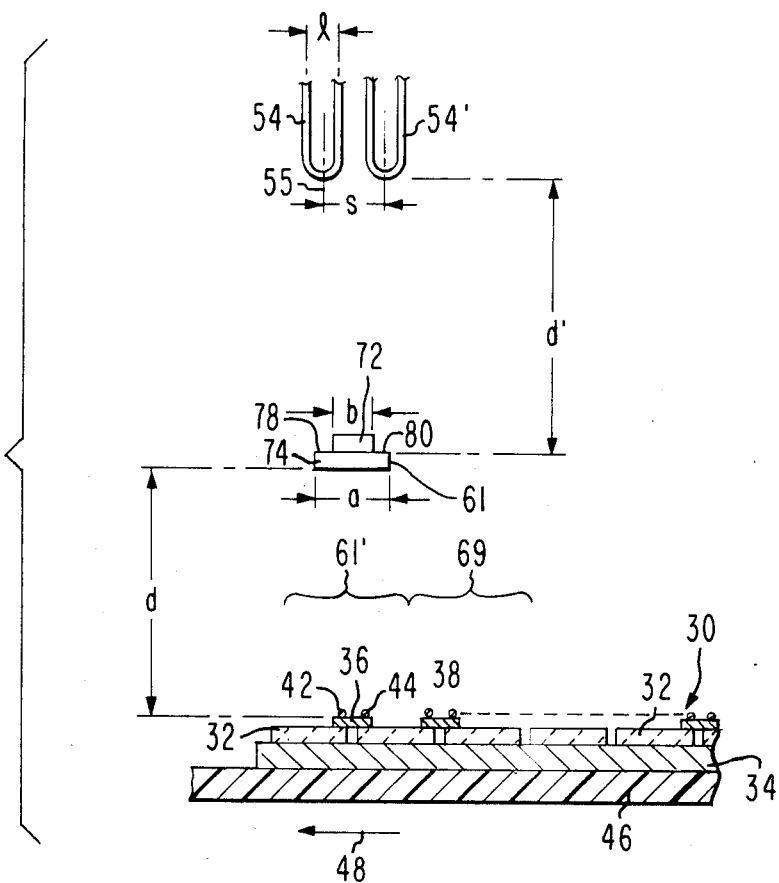
FIG. 5 is a side elevation view, partially in section, of a portion of the apparatus of FIG. 3 illustrating the relationship of induction heating coils, susceptor, and a subpanel array.

In FIGS. 4 and 5, a typical subarray 30 during soldering is upside-down from the orientation of the subarrays 12 of FIG. 2 attached to support 14. The upside-down arrangement of subarray 30 is for purposes of soldering the links to the cells. The subarray 30 comprises a matrix of cells 32 which are lain on a flat aluminum alloy support plate 34. Cells 32 are placed with their active front faces resting on plate 34. Link 36, FIG. 4, couples the cells of cell array 32' to cell array 32". The links in each subarray may comprise one-inch by one-foot strips which are placed onto overlapping electrode regions of two adjacent arrays of cells, e.g., arrays 32' and 32". A second link 38, which is the same material as link 36, is placed onto the next two adjacent arrays of cells such as arrays 32" and 32'''. The cells rest coplanar on the horizontal plate 34 via gravity. A length of lead-tin-silver solder wire 42 is placed on link 36 juxtaposed with the appropriate electrodes of the cells of array 32'. A second solder wire 44 is lain over link 36 and juxtaposed over the electrodes of cell array 32". Similar solder wires are lain over link 38 and each other link of the subarray in alignment with the adjacent electrodes of the solar cells.

In FIG. 3, system 28 simultaneously and successively melts each solder wire of a subarray such as subarray 30, FIG. 4, one at a time. System 28 comprises an induction heating system 42 and a conveyor system 45. Conveyor system 45 comprises a conveyor belt 46 driven in direction 48 by apparatus (not shown). Belt 46 comprises a fiberglass reinforced woven epoxy impregnated composite material. This belt exhibits relatively little absorption of radiated heat, for reasons to be explained and may be about ¼-inch thick in one implementation. The belt is moved in direction 48 at a desired rate according to the various parameters of the system 28 as will be explained. In one implementation, the conveyor belt is moved at a five-foot/minute rate when employing subarrays 12', 12" and so forth, of one-foot square dimensions and two inch×two inch square solar cells.

Induction heating system 42 comprises an induction heating generator 50 coupled to a coplanar array 52 of coil pairs 54 and 54'; 56 and 56'; 58 and 58'; and 60 and 60'. Each coil comprises a bent copper wire lying in a plane. The plane defined by each coil is coplanar with the plane of the coil array 52. The coils in one implementation may comprise ¼-inch diameter wire. Each coil has the same transverse width center-to-center dimension 1, which, for example, may be about ¾-inch in this embodiment employing a generator 50 of about 5 kw of power. The coils of each pair, for example, pair 54 and 54' are spaced apart a center-to-center distance S. Distance S may be about one-and-one-half inches. The long axis of the coils, for example, axis 55 of coil 54, is perpendicular to the plane of the conveyor belt 46, the coils extending about one foot in their length dimension. The plane of the coils is parallel to direction 48.

A plurality of spaced susceptor blocks 61–64, FIG. 3, are suspended vertically aligned between respective different corresponding coil pairs and the belt 46. The blocks are spaced apart a center-to-center distance t which may be about six inches. Block 61 is aligned with coil pair 54 and 54'; block 62 is aligned with coil pair 56 and 56'; and so forth. The blocks are aligned centrally over the belt 46 in a direction orthogonal to direction 48.

In FIG. 5, subarray 30 is assumed aligned with block 61 for purposes of illustration. Susceptor block 61 is suspended from support 66 by elongated arm 68, which is stainless steel to minimize heat generation from the induction coils and thus to thermally conductively isolate the susceptors. Generator 50 and support 66 are attached to a supporting structure represented by symbols 70. Blocks 61–64 are aluminum to insure good heating characteristics in response to the corresponding induction fields. The arms 68 have relatively little affect on the heating of the blocks 61-64 in the presence of the induction heating fields of the coils.

Figure 6:
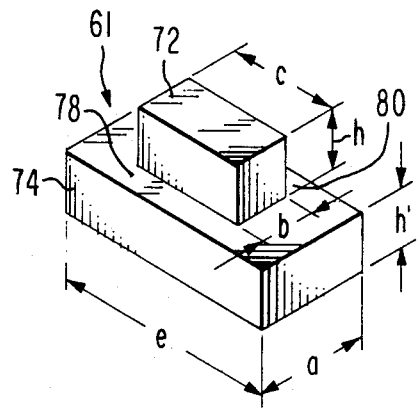
FIG. 6 is an isometric view of one susceptor employed in the present embodiment.

In FIG. 6, block 61 is representative of the construction of blocks 62-64 which are identical. Block 61 is solid aluminum and comprises a solid rectangular portion 72 which extends from a larger similarly shaped rectangular portion 74. In this embodiment, portion 72 has a length c, a width b, and a thickness h. Dimension c is twice the dimensions b and h which are the same. Portion 74 has a width a, a height h', and a length e. Dimension a is the same as dimensions c and h'. Dimension e is twice the dimension a. By way of example, dimension h may be one inch in one embodiment. The susceptors may have other relative dimensions in accordance with a given implementation. In FIG. 5, coil 54 is aligned with shoulder 78 of portion 74 and coil 54' is aligned with shoulder 80. The coils 54 and 54' are oriented such that they point perpendicular to the shoulders 78 and 80 which are parallel to belt 46.

Silver solder wires 42 and 44, FIG. 5, are required to be heated to a temperature above about 400° F. in order to melt. By way of example, the wires 42 and 44 may comprise tin-lead-silver alloy (62-36-2) which has a melting point of 179° C. (354° F.). The solder wires may comprise flux core wire having a diameter of about 0.032 inch.

The solder wires are spaced from the susceptor blocks 61-64 a distance d. The susceptor blocks are spaced from the induction coils a distance d'. These spacings are set at those values which provide a heating region for the solder wires on the conveyor belt 46 directly aligned beneath the corresponding susceptor block. Susceptor blocks 61-64 create respective heating regions 61', 62', 63', and 64' at the conveyor belt 46, FIG. 3. Each heating region has a temperature range above about 400° F. and extends across the width of belt 46. The conveyor belt 46 moves in direction 48 at a given rate to pass each solder wire in the heated region for a time sufficient for the solder to melt. To create such a heating region at belt 46, the susceptor blocks have an operating temperature range of about 400°-450° F. in one implementation where dimension a is two inches and distances d and d' are one foot each employing the 5 kw generator 50 mentioned previously.

When a length of solder wire passes in a heating region it is simultaneously raised above its melting temperature for its entire length. To provide such an elevated temperature region at the conveyor belt 46, the induction generator 50, FIG. 3, is cycled on and off to periodically inductively heat the susceptor blocks. By way of example, in this implementation the "on" cycle may be for a period of about one to two minutes and the "off" cycle may be for a period of about five minutes. The susceptor blocks being solid aluminum, readily induce heat in response to the inductive energy generated by the adjacent coils. That heat is retained in the susceptor blocks for the period generator 50 cuts off. This cycling of the generator 50 establishes a temperature range for each susceptor block such that the radiant energy from that susceptor block in the heated region directly beneath at the conveyor belt 46 is as desired. In FIG. 5, that heating region extends in and out of the drawing for the length of solder wires 42 and 44 extending across the entire width of a given subarray, for example, subarray 12', FIG. 3.

However, the solder melting temperature regions generated by the array of susceptor blocks at belt 46 are not contiguous. A reduced second temperature region, for example, about 250°-300°, is midway between adjacent 400° temperature regions created by the susceptor blocks. Thus, as the conveyor belt 46 moves in the direction 48, FIG. 3, the solder wires enter the solder melting temperature region as they pass beneath a given susceptor block, for example, region 64' created by block 64. As the wires pass out of that region they pass into the lower temperature region 65 and are exposed to a temperature in the range of 250°-300° F. This temperature range is sufficiently below the melting point of the solder wires to permit them to solidify.

The continuous conveying of the now solidified solder exposes them to the elevated temperature region created by the next adjacent susceptor block, for example, region 63' created by block 63. Similarly, blocks 61 and 62 create respective solder melting regions 61' and 62'. Spaced between solder melting regions 61' and 62' is cooling region 69 and spaced between solder melting regions 62' and 63' is cooling region 67. In this way, as the solder wires pass in a region aligned with the space between the susceptor blocks the solder wires solidify. As the wires continue to move beneath and close to the susceptor blocks they melt. This process of alternate melting and solidification occurs successively as the subarrays are conveyed in direction 48 until the radiant heat from the last susceptor block, e.g., block 61 is decoupled from that assembly.

The blocks 61, 62, 63, and 64 are spaced apart a distance sufficient to provide the cooling zones region therebetween. By way of example, in a system employing a 5 kw heat generator as described herein with the conveyor moving at about three feet per minute, the solder wires are in a heating region for a period of about 1.5 minutes and are then passed through a cooling region for about two minutes.

The distances d and d', FIG. 5, are established empirically for providing the desired two temperature regions--the elevated temperature region for melting the solder wires and the lowered temperature region for permitting the wires to resolidify. The blocks 61-63, FIG. 3, have a sufficient length e which is orthogonal to direction 48 of belt movement to provide radiant heat across the entire width of the subarrays to simultaneously melt the entire length of the solder wires as they pass through the respective heating regions. As that wire enters into the lower temperature region it resolidifies simultaneously along its entire length. Therefore, each wire melts and solidifies in its entirety simultaneously as it passes through each respective temperature region. The wire successively passes through each temperature region until the wires have been melted and resolidified four times corresponding to the four susceptor blocks. It should be understood that the wires lose their "wire" shape when they melt and the reference to the melted solder as "wires" is only for purposes of explanation. In practice, the wires when initially melted at the first susceptor heated region tend to flow through the link perforations and attach to the cell electrodes and to the links.

The successive melting and resolidifying of the solder is important. It has been determined empirically that one melting and solidification cycle tends to cause air entrapment in the melted solder. By remelting and resolidifying several times, it has been observed that the trapped air is released and an excellent solder joint is created. By way of example, panels soldered with infrared heat in the prior art process thermally cycled to the temperature range mentioned above resulted in stress failure in the solder joints after 13,000 cycles of exposure to temperature cycling in a range of −160° to +60° C. In subarrays produced according to the present invention thermally cycled to the same temperature range, 26,000 cycles produced no stress failure.

Supporting plate 34, FIG. 5, supports cells 32 and their connecting links in a plane. Solar cells 32 have a coating thereon in contact with the plate 34. If that coating exceeds a given temperature, the coating can be damaged or destroyed. Therefore, it is important that the coating on the solar cells remain below their critical temperature. The belt 46 is made of material mentioned previously so that it absorbs and retains negligible heat. This is important to prevent the belt 46 from absorbing heat and raising the temperature of plate 34 which may seriously affect the coating on the solar cells. In one example, plate 34 may be one-inch thick aluminum alloy. This plate, because of its alloy composition, does not absorb sufficient heat from the susceptors to raise its temperature significantly. By conveying the subarrays on belt 46 in a linear direction 48, the linear array of inductive coils and corresponding susceptor blocks tend to provide uniform and repeatable heating and resolidification of the solder wires. This is important in order to maintain control over the solder quality. Of course, the spacing of the susceptor blocks to the heating coils and the belt and the dimensions of the blocks may differ for different implementations. After the subarrays are processed as described above they may be stored for subsequent assembly into an appropriate panel 10, FIG. 1.

The present process is continuous in that the subarrays are conveyed on the belt 46, FIG. 3, to complete the soldering portion of the process. While four susceptor blocks are illustrated in the present embodiment, it can be appreciated that more or fewer blocks may be used depending upon a particular implementation. The susceptor blocks need not extend across the entire transverse width of the subarray, as illustrated herein.

What is claimed is:

1. Apparatus for soldering a link carried by an element, one of said element and link carrying solder which, when melted, bonds the link to the abutting element, said apparatus comprising:
   induction heating means;
   a heat radiating susceptor spaced from and adapted to be inductively heated by the induction heating means;
   element support means including means adapted for carrying said element, link and solder to be melted; and
   conveying means for carrying said support means spaced from the susceptor at that distance and moving at that rate which permits the susceptor to radiantly heat said solder causing the solder to melt as it moves along a given path through a region heated by said susceptor.

2. The apparatus of claim 1 including a plurality of spaced susceptors, each susceptor heating a separate, different, spaced region along said path, the spacing of said regions being such that the radiant heat is insufficient to melt the carried solder in areas between the regions to thereby permit the solder to be successively melted and solidified in a continuous process.

3. Apparatus for soldering first and second abutting elements adapted to bear solder to be melted comprising:
   conveying means adapted for carrying said elements and solder in a given path; and
   an array of spaced heater means adapted for radiating heat toward said given path, said heater means being spaced such that said heat is sufficient in magnitude in a plurality of first spaced regions along said given path to heat said carried solder to a first temperature above its melting point and is sufficiently reduced in magnitude in a plurality of second spaced regions alternating with the first regions along said path to permit the heated solder to cool to second temperature below its melting point so that the solder borne by said elements alternately melts and then solidifies as the elements are conveyed in said path.

4. The apparatus of claim 3 wherein said heater means include a plurality of susceptors adapted for retaining heat over a given time interval and for radiating said retained heat toward said given path; and
   control means including inductive heating means for cyclically heating said susceptors for maintaining the temperatures in said first and second regions.

5. The apparatus of claim 3 wherein said heater means includes a plurality of induction heating coils and a plurality of spaced susceptor blocks spaced from the coils, each block corresponding to a separate different coil pair and including means adapted for retaining and radiating heat induced by that corresponding coil pair.

6. The apparatus of claim 3 wherein said heater means includes means for cyclically melting, and then solidifying said borne solder at least twice.

7. Apparatus for soldering a plurality of elements adapted to carry a connector link and unmelted solder to be melted by radiation for connecting the link to the elements, said apparatus comprising:
   an array of spaced heat retaining and heat radiating susceptors;
   induction heating means spaced from the susceptor array and including coil means for inductively heating said susceptors to within a given first temperature range so that the radiated heat adjacent each susceptor is in a second temperature range sufficient to melt the solder in a first region spaced from said susceptors and in a third temperature range insufficient to melt solder in a second region spaced from said susceptors, said susceptors being spaced such that said first and second regions lie in a given path to form a plurality of alternating first and second regions; and
   conveying means adapted to carry said elements, link, and said solder in said given path to thereby repetitively and alternately melt and solidify said carried solder.

8. The apparatus of claim 7 wherein said second temperature range is above about 400° F. and said third temperature range is less than about 300°.

9. The apparatus of claim 7 wherein said conveying means includes an element support for holding said elements coplanar.

10. The apparatus of claim 7 wherein said susceptors each comprise a block of aluminum and said coil means includes a pair of elongated induction coils adjacent each block, said coil pair lying substantially coplanar and pointing toward the corresponding adjacent block.

11. The apparatus of claim 7 wherein said conveying means includes a fiberglass mesh belt moving at a rate such that the carried solder remains in the first region for a time sufficient to melt and in said second region for a time sufficient to solidify.

12. The apparatus of claim 7 wherein said susceptors each comprise a block of aluminum having a first solid portion thermally conductively coupled to a second solid portion, the mass of the second portion being greater than the mass of the first portion and facing said conveying means.

13. The apparatus of claim 12 wherein said portions are each rectangular having a long axis, said long axis extending in a direction orthogonal to the direction of said path.

14. The apparatus of claim 7 wherein said induction heating means includes a plurality of heating coil pairs, said pairs being aligned in a linear array, said susceptors comprising a like plurality, each susceptor corresponding to a separate, different coil pair, said apparatus including means for suspending each susceptor in the space between its corresponding coil pair and said conveying means.

15. Apparatus for soldering an array of solar cells comprising:

an array of spaced induction heating means;

a like array of spaced induction heated susceptors, each aligned with a separate different heating means for being inductively heated by that different heating means, said susceptors being spaced from a given path, said heating means including means for heating each susceptor an amount such that that susceptor heats by radiating a first region of said path corresponding to that susceptor to a temperature above the melting point of the solder, the spacing of said susceptors being such that second regions of said path between said first regions are heated in a temperature range below that of the melting point of the solder;

solar cell support means for supporting said array of solar cells; and means for transporting said support means such that said supported array of solar cells is carried in said path at a rate to permit solder coupled to said cells on said support means to remain in said first regions for a time sufficient to melt the solder.

* * * * *